(12) United States Patent
Lee et al.

(10) Patent No.: US 9,343,693 B2
(45) Date of Patent: May 17, 2016

(54) ORGANIC LIGHT EMITTING DIODE AND ORGANIC LIGHT EMITTING DISPLAY APPARATUS HAVING THE SAME

(71) Applicant: Samsung Display Co., LTD., Yongin, Gyeonggi-Do (KR)

(72) Inventors: Chang-Ho Lee, Suwon-si (KR); Hyun-Ju Choi, Seoul (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/319,515

(22) Filed: Jun. 30, 2014

(65) Prior Publication Data

US 2015/0008408 A1 Jan. 8, 2015

(30) Foreign Application Priority Data

Jul. 3, 2013 (KR) .................. 10-2013-0077512

(51) Int. Cl.
*H01L 29/08* (2006.01)
*H01L 35/24* (2006.01)
*H01L 51/00* (2006.01)
*H01L 51/50* (2006.01)

(52) U.S. Cl.
CPC ......... *H01L 51/5064* (2013.01); *H01L 51/0072* (2013.01); *H01L 51/0085* (2013.01)

(58) Field of Classification Search
USPC ............... 257/40, E51.041, E51.044, E51.05, 257/102, 103; 313/504; 428/690, 917
See application file for complete search history.

(56) References Cited

U.S. PATENT DOCUMENTS

| 6,303,238 | B1 | 10/2001 | Thompson et al. | |
| 6,902,830 | B2 | 6/2005 | Thompson et al. | |
| 8,597,965 | B2 * | 12/2013 | Hatano et al. | 438/29 |
| 2006/0199038 | A1 * | 9/2006 | Lee | 428/690 |
| 2009/0191427 | A1 | 7/2009 | Liao et al. | |
| 2012/0068168 | A1 * | 3/2012 | Lee et al. | 257/40 |
| 2012/0206675 | A1 * | 8/2012 | Seo et al. | 349/96 |
| 2012/0217516 | A1 * | 8/2012 | Hatano et al. | 257/88 |
| 2012/0274201 | A1 | 11/2012 | Seo et al. | |
| 2012/0286312 | A1 * | 11/2012 | Hatano et al. | 257/98 |
| 2013/0119357 | A1 * | 5/2013 | Kim et al. | 257/40 |
| 2013/0204003 | A1 | 8/2013 | Osaka et al. | |

FOREIGN PATENT DOCUMENTS

KR 10-2012-0122931 A 11/2012
KR 10-2013-0020948 A 3/2013

* cited by examiner

*Primary Examiner* — Telly Green
(74) *Attorney, Agent, or Firm* — Knobbe Martens Olson & Bear LLP

(57) ABSTRACT

An organic light emitting diode includes a hole injection layer, a hole transport layer, an optical compensation layer, an emission layer, an electron transport layer and an electron injection layer. The optical compensation layer is disposed on the hole transport layer and includes a phosphorescent host material. Thus, an electron barrier on an interface between the optical compensation layer and an emission layer may be reduced. Thus, the luminance efficiency in a low gray scale area may be decreased, and the stain and roll-off phenomenon in the low gray scale area may be improved.

20 Claims, 3 Drawing Sheets

ORGANIC LIGHT EMITTING DIODE AND ORGANIC LIGHT EMITTING DISPLAY APPARATUS HAVING THE SAME

CROSS-REFERENCE TO RELATED APPLICATIONS

This U.S. non-provisional application claims priority under 35 U.S.C. §119 to Korean Patent Application No. 10-2013-0077512, filed on Jul. 3, 2013, the disclosure of which is incorporated by reference herein in its entirety.

BACKGROUND

1. Field

The disclosed technology relates to an organic light emitting diode and an organic light emitting apparatus having the same. More particularly, an organic light emitting diode with an improved efficiency and a decreased stain on a display panel and an organic light emitting apparatus having the same are disclosed.

2. Description of the Related Technology

An organic light emitting apparatus displays an image by an organic light emitting diode (OLED). The OLED generates a light by itself. The OLED does not need a backlight, so that the size, thickness, weight and power consumption may be decreased. Furthermore, OLED has an excellent color gamut and a response time.

The OLED may be divided into a fluorescence organic light emitting diode and a phosphorescence organic light emitting diode based on the emitting route of organic molecules. An inner quantum efficiency of the fluorescence OLED is about 25%, but an inner quantum efficiency of the phosphorescence OLED is about 100%. Thus, the phosphorescence OLED has a better efficiency than the fluorescence OLED.

The OLED for displaying different colors may have different thicknesses. Thus, a compensation layer may be needed to compensate a different thickness.

Generally, the compensation layer may be formed by a material of the hole transport layer, so that the retention time of the triplet exciton may increase in the high gray scale area. That is, efficiency may sharply decrease by increasing a current. Furthermore, a display panel may have a stain due to the change of the thin-film transistor (TFT) driving voltage and current in the low gray scale area.

SUMMARY OF CERTAIN INVENTIVE ASPECTS

In some aspects, the disclosed technology relates to an organic light emitting diode with improved efficiency and a decreased stain on a display panel by including a phosphorescent host material.

In some aspects, the disclosed technology relates to an organic light emitting apparatus having the above-mentioned organic light emitting diode.

In some embodiments, an organic light emitting diode includes a hole injection layer, a hole transport layer, an optical compensation layer, an emission layer, an electron transport layer and an electron injection layer.

The hole transport layer is disposed on the hole injection layer. The optical compensation layer is disposed on the hole transport layer and including a phosphorescent host material. The emission layer is disposed on the optical compensation layer. The electron transport layer disposed on the emission layer. The electron injection layer disposed on the electron transport layer.

In some embodiments, a thickness of the optical compensation layer may be in a range from about 20 nm to about 50 nm.

In some embodiments, the phosphorescent material may include N,N-dicarbazolyl-3,5-benzene.

In some embodiments, the hole transport layer may include at least one selected from the group consisting of N,N'-bis(3-methylphenyl)-N,N'-diphenyl-(1,1-biphenyl)-4,4'-diamine and N,N'-di-1-naphtal-N,N'-diphenyl-1,1'-biphenyl-4,4'-diamine.

In some embodiments, the emission layer may include a matrix polymer, a phosphorescent host material and a phosphorescent dopant.

In some embodiments, the matrix polymer may include at least one selected from the group consisting of polyphenylvinylene, polyvinylcarbazole, polyfluorene and derivatives thereof.

In some embodiments, the phosphorescent host material may be carbarzole compound.

In some embodiments, the carbazole compound may include at least one selected from the group consisting of N,N-dicarbazolyl-3,5-benzene, 1,3,5-tri(9-carbazolyl)benzene, 4,4'-bis(N-carbazolyl)-1,1'-biphenyl, 4,4'-biscarbazolyl-2,2'-dimethylbiphenyl, 4,4',4"-tri(N-carbazolyl)triphenylamine, 1,3,5-tri(2-carbazolylphenyl)benzene, 1,3,5-tri(2-carbazolyl-5-methoxyphenyl)benzene and bis(4-carbazolyl) silane.

In some embodiments, the phosphorescent dopant may include at least one selected from the group consisting of bisthienylpyridine acetylacetonate iridium, bis(benzothienylpyridine)acetylacetonate iridium, bis(2-phenylbenzothiazole)acetylacetonate iridium, bis(1-phenylisoquinoline) iridium acetylacetonate, tris(1-phenylisoquinoline) iridium and tris(2-phenylpyridine) iridium.

In some embodiments, the organic light emitting diode may further include a first electrode disposed on a lower surface of the hole injection layer and a second electrode disposed on an upper surface of the electron injection layer.

In some embodiments, the first electrode may be an anode and the second electrode may be a cathode.

In some embodiments, an organic light emitting apparatus includes a first substrate, a second substrate, a first electrode, a hole injection layer, a hole transport layer, an optical compensation layer, an emission layer, an electron transport layer, an electron injection layer and a second electrode.

The second substrate faces the first substrate. The first electrode is disposed on the first substrate. The hole injection layer is disposed on the first substrate. The hole transport layer is disposed on the hole injection layer. The optical compensation layer is disposed on the hole transport layer and including a phosphorescent host material. The emission layer is disposed on the optical compensation layer. The electron transport layer is disposed on the emission layer. The electron injection layer is disposed on the electron transport layer. The second electrode is disposed on the electron injection layer.

In some embodiments, the thickness of the optical compensation layer may be about 20 nm to about 50 nm.

In some embodiments, the phosphorescent material may include N,N-dicarbazolyl-3,5-benzene.

In some embodiments, the hole transport layer may include at least one selected from the group consisting of N,N'-bis(3-methylphenyl)-N,N'-diphenyl-(1,1-biphenyl)-4,4'-diamine, N,N'-di-1-naphtal-N,N'-diphenyl-1,1'-biphenyl-4,4'-diamine.

In some embodiments, the emission layer may include a matrix polymer, a phosphorescent host material and a phosphorescent dopant.

In some embodiments, the phosphorescent host material may be carbarzole compound.

In some embodiments, the carbazole compound may include at least one selected from the group consisting of N,N-dicarbazolyl-3,5-benzene, 1,3,5-tri(9-carbazolyl)benzene, 4,4'-bis(N-carbazolyl)-1,1'-biphenyl, 4,4'-biscarbazolyl-2,2'-dimethylbiphenyl, 4,4',4"-tri(N-carbazolyl)triphenylamine, 1,3,5-tri(2-carbazolylphenyl)benzene, 1,3,5-tri(2-carbazolyl-5-methoxyphenyl)benzene and bis(4-carbazolyl) silane.

In some embodiments, the organic light emitting diode may further include a protection layer disposed on the first substrate and covering the second electrode.

In some embodiments, the first electrode may be an anode and the second electrode may be a cathode.

In some embodiments, an organic light emitting diode and an organic light emitting apparatus include an optical compensation layer including a phosphorescent host material. An electron barrier on an interface between the optical compensation layer and an emission layer may be thereby formed. Thus, the luminance efficiency in the low gray scale area may be decreased. Therefore, a stain may be decreased and a roll-off phenomenon may be improved.

DETAILED DESCRIPTION OF CERTAIN INVENTIVE EMBODIMENTS

Figure 1:
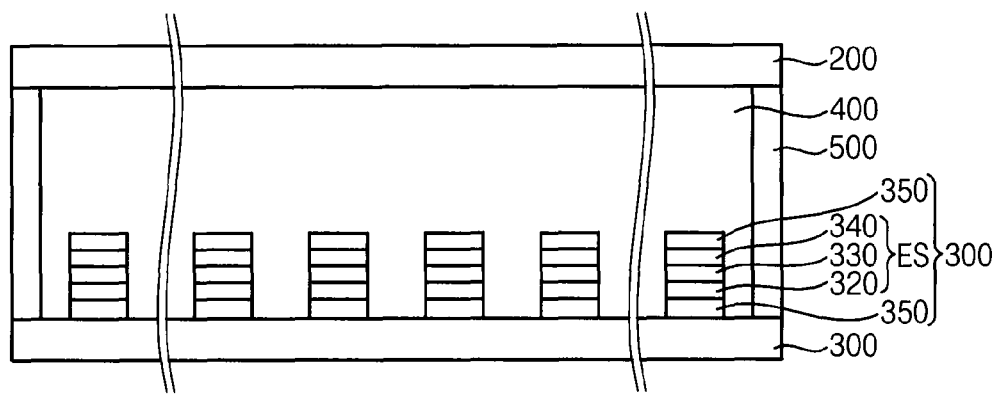
FIG. 1 is a cross-sectional view illustrating an organic light emitting apparatus.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this disclosure will be thorough and complete, and will fully convey the scope of the present inventive concept to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments will be described in detail with reference to the accompanying drawings.

Figure 2:
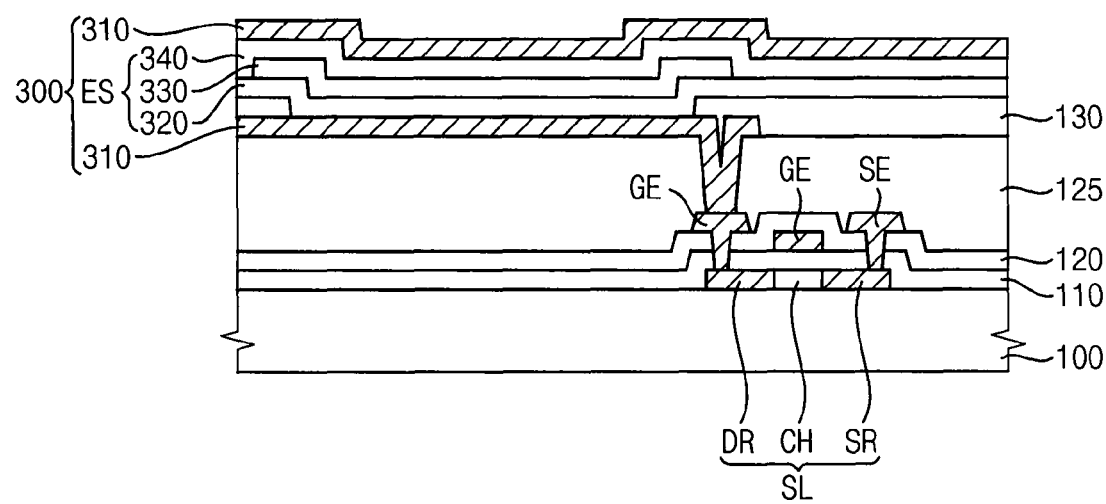
FIG. 2 is a partial enlarged-view illustrating an organic light emitting apparatus in FIG. 1.

FIG. 1 is a cross-sectional view illustrating an organic light emitting apparatus. FIG. 2 is a partial enlarged-view illustrating the organic light emitting apparatus illustrated in FIG. 1.

Referring to FIGS. 1 and 2, an organic light emitting apparatus includes a first substrate 100 and a second substrate 200. The first substrate 100 may include a plurality of organic light emitting structures ES, which define pixel areas. The second substrate 200 may face the first substrate 100 to encapsulate the organic light emitting structures ES. The organic light emitting apparatus may further include a switching element between the first substrate 100 and the organic light emitting structure. In accordance with an exemplary embodiment of the present invention, the organic light emitting apparatus may further include a sealant 500 and an absorbent (not illustrated).

In some embodiments, the first substrate 100 may be a transparent insulation substrate. Examples of the first substrate 100 may be, but are not limited to, a glass substrate, a quartz substrate, a plastic substrate, a polyethylene terephthalate resin substrate, a polyethylene resin substrate, a polycarbonate resin substrate, and any combinations thereof. Furthermore, the first substrate 100 may be formed of a flexible substrate.

The switching element may include a semiconductor layer SL, a gate insulation layer 110, a gate electrode GE, a first insulation layer 120, a drain electrode DE, a source electrode SE and a second insulation layer 125.

In some embodiments, the semiconductor layer SL may be formed on the first substrate 100. The semiconductor layer SL may include a channel area CH, a drain region DR and a source region SR. The drain region DR may be electrically connected to the drain electrode DE. The source region SR may be electrically connected to the source electrode SE. The channel area CH may be disposed between the drain region DR and the source region SR.

The gate insulation layer 110 may be disposed on the first substrate 100, where the semiconductor layer SL is formed.

The gate insulation layer 110 may cover the semiconductor layer SL. The gate insulation layer 110 may include a silicon oxide, a silicon nitride, etc.

The gate electrode GE may be electrically connected to the gate line (not illustrated) and applying a gate signal. The gate electrode GE may overlap the channel area CH. For example, the gate electrode GE may be formed in a same layer as the gate line.

In some embodiments, the first insulation layer 120 can be disposed on the first substrate 100, where the gate electrode GE is formed. The first insulation layer 120 may cover the gate electrode GE. The first insulation layer 120 may include a silicon oxide, a silicon nitride, etc.

The source electrode SE may be electrically connected to the source region SR of the semiconductor layer SL through a first contact hole and may be provided a data signal. The first contact hole is formed through the gate insulation layer 110 and the first insulation layer 120.

The drain electrode DE may be electrically connected to the drain region DR of the semiconductor layer SL through a second contact hole. The second contact hole is formed through the gate insulation layer 110 and the first insulation layer 120.

The switching element in FIG. 2 has a top-gate structure including a gate electrode GE disposed on a semiconductor layer SL. However, examples of the switching element are not limited thereto. For example, another example of the switching element may have a bottom-gate structure including a semiconductor layer disposed on a gate electrode.

The second insulation layer 125 may be disposed on the first substrate 100, where the source electrode SE and the drain electrode DE are formed. The second insulation layer 125 may cover the source electrode SE and the drain electrode DE. The second insulation layer 125 may have a substantially flat upper surface.

In some embodiments, each of the organic light emitting diode 300 may include a first electrode 310, an organic light emitting structure ES and a second electrode 350.

The first electrode 310 may be disposed on the first substrate 100, where the second insulation layer 125 is formed. The first electrode 310 may be electrically connected to the drain electrode DE. The first electrode 310 may be a transparent electrode or a translucent electrode. For example, the first electrode 310 may include, but is not limited to, indium zinc oxide (ITO), indium tin oxide (IZO), zinc oxide (ZnOx) and tin oxide (SnOx). The first electrode 310 may be an anode providing holes to the organic light emitting structure ES.

In some embodiments, the organic light emitting apparatus may further include a pixel defining layer 130 disposed between the organic light emitting structure ES and the first electrode 310. The pixel defining layer 130 may be disposed on the first electrode 310 and the second insulation layer 125. The pixel defining layer 130 may include an opening. The opening may expose a portion of the first electrode 310. The organic light emitting structure ES is disposed on the first electrode 310 and the second electrode 350 is disposed on the organic light emitting structure ES. Thus, an area, where the opening is disposed, may be defined as a display area, and a remaining area may be defined as a peripheral area.

The pixel defining layer 130 may include an organic insulation material, such as a polymer. Examples of suitable polymer include but are not limited to a polymer including a phenol group, polyacryl, polyimide, polyarylether, polyamide, fluorinated polymer, p-xylene polymer, vinylalcohol polymer and any combinations thereof. Alternatively, the pixel defining layer 130 may include an inorganic insulation material. The pixel defining layer 130 may have a multi-layered structure including an organic insulation material and an inorganic insulation material.

In some embodiments, the light emitting diode 300 can include a hole injection layer and a hole transfer layer 320, an emission layer 330 and an electron transfer layer and an electron injection layer 340. Holes may be provided from the first electrode 310 into the hole injection layer and the hole transfer layer 320. Electrons may be provided from the second electrode 350 into the electron transfer layer and the electron injection layer 340.

Holes and electrons may be combined in the emission layer 330 to thereby generate a light. The organic light emitting diode 300 may include a light emitting material generating a red light, a green light, or a blue light. Alternatively, the organic light emitting diode 300 may include a plurality of light emitting materials generating lights having different wavelengths or mixture thereof. The detailed description about the organic light emitting diode 300 may be further descried in FIG. 3.

The second electrode 350 may be disposed on the first substrate 100, where the organic light emitting structure ES is disposed. The second electrode 350 may include a reflective electrode. Examples of a material that may be used for the second electrode 350 may include, but are not limited to, aluminum (Al), platinum (Pt), silver (Ag), gold (Au), chromium (Cr), tungsten (W), molybdenum (Mo), titanium (Ti), and alloy thereof. The second electrode 350 may be a cathode providing electrons to the organic light emitting structure ES.

As shown in FIG. 1, the organic light emitting apparatus may include a protection layer 400 disposed on the first substrate 100. The protection layer 400 may cover the second electrode 350. The protection layer 400 may include a silicon encapsulant. The silicon encapsulant may have a good flowability and may be easily hardened with a low temperature. Thus, the silicon encapsulant may decrease thermal stress generated during a molding process, so that bending of the first substrate 100 and the second substrate 200 may be minimized.

The organic light emitting apparatus may include a sealant 500 sealing the first substrate 100 and the second substrate 200. The sealant 500 may protect the organic light emitting structure ES from an outside air. Furthermore, the sealant 500 may prevent a phenomenon that a material of the protection layer 400 flows out from the substrates. For example, the sealant 500 may include an ultraviolet hardener such as an epoxy resin or a thermal hardener.

The organic light emitting apparatus includes a second substrate 200 facing the first substrate 100. The second substrate 200 may encapsulate the organic light emitting diode 300. The second substrate 200 may be a transparent insulation substrate Example, of the second substrate 200 may be, but are not limited to, a glass substrate, a quartz substrate, a plastic substrate, a polyethylene terephthalate resin substrate, a polyethylene resin substrate, a polycarbonate resin substrate, and any combinations thereof. Furthermore, the second substrate 200 may be a flexible substrate. The first substrate 100 and the second substrate 200 may be formed from a substantially identical material. Alternatively, the first substrate 100 and the second substrate 200 may be formed from different materials.

In some embodiments, the organic light emitting apparatus may include at least one absorbent (not illustrated). The absorbent may disposed on a lower surface of the second substrate 200. For example, the absorbent may include a barium oxide, a gallium oxide, a calcium oxide, a zeolite and other metal oxide. The absorbent may include a transparent porous nano polymer layer.

Figure 3:
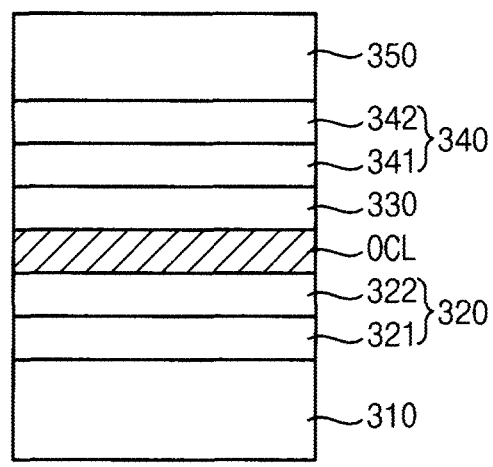
FIG. 3 is a cross-sectional view illustrating an organic light emitting diode.

FIG. 3 is a cross-sectional view illustrating an organic light emitting diode.

Referring to FIG. 3, an organic light emitting diode 300 include a first electrode 310, a hole injection layer 321 disposed on the first electrode 310, a hole transport layer 322 disposed on the hole injection layer 321, an optical compensation layer OCL disposed on the hole transport layer 322 and including a phosphorescent host material, an emission layer 330 disposed on the optical compensation layer OCL, an electron transport layer 341 disposed on the emission layer 330, an electron injection layer 342 disposed on the electron transport layer 341 and a second electrode 350 disposed on the electron injection layer 342.

The first electrode 310 may be an anode providing holes into the hole injection layer 321. The second electrode 350 may be a cathode providing electrons into the electron injection layer 342.

The first electrode 310 may provide holes into the hole injection layer 321 and the hole transport layer 322. The second electrode 350 may provide electrons into the electron transport layer 341 and the electron injection layer 342.

Holes and electrons may be combined in the emission layer 330, to thereby generate a light. The organic light emitting diode 300 may include a light emitting material generating a red light, a green light, or a blue light. Alternatively, the organic light emitting diode 300 may include a plurality of light emitting materials generating lights having different wavelengths or mixture thereof.

In accordance with an exemplary embodiment of the present invention, the hole transport layer 322 may include N,N'-bis(3-methylphenyl)-N,N'-diphenyl-(1,1-biphenyl)-4,4'-diamine (TPD) represented by Chemical Formula 1, N,N'-di-1-naphthyl-N,N'-diphenyl-1,1'-biphenyl-4,4'-diamine (α-NPD) represented by Chemical Formula 2 or mixture thereof.

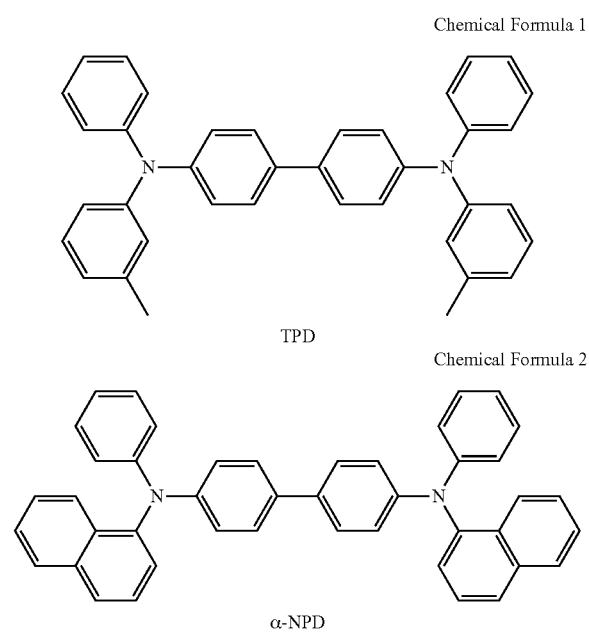

Chemical Formula 1

TPD

Chemical Formula 2

α-NPD

In some embodiments, an organic light emitting diode includes an optical compensation layer OCL.

The optical compensation layer may be disposed on the hole transport layer 322 and including a phosphorescent host material.

The thickness of the optical compensation layer OCL may be in a range of from about 20 nm to about 50 nm. When the thickness of the optical compensation layer OCL is less than 20 nm, the luminance efficiency may be more than 100 cd/A in a low gray scale area less than 500 cd/m². When the thickness of the optical compensation layer OCL is more than 50 nm, the driving voltage is too high and power consumption may increase.

The optical compensation layer OCL may include a phosphorescent host material. The phosphorescent host material may include N,N-dicarbazolyl-3,5-benzene (mCP) represented by Chemical Formula 3.

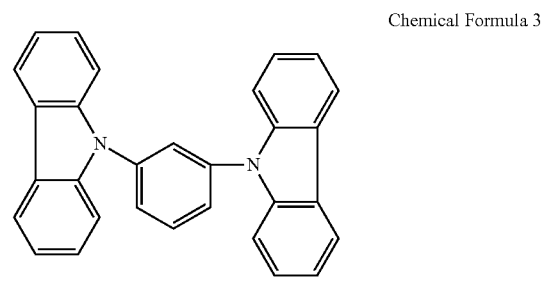 [SMILES: c1cc(-n2c3ccccc3c3ccccc32)cc(-n2c3ccccc3c3ccccc32)c1]

Chemical Formula 3

The electron barrier on an interface between the optical compensation layer and the emission layer 330 may be reduced in the low gray scale area, which is in a low voltage state when the optical compensation layer OCL includes the phosphorescent host material. Thus, a recombination probability between electrons and holes may be decreased and the luminance efficiency in the low gray scale area may be decreased. Therefore, a stain caused by a high luminance efficiency in the low gray scale area may be decreased.

When the optical compensation layer OCL includes the phosphorescent host material, a light emitting region is positioned at an interface between the optical compensation layer OCL and the emission layer 330 in the low voltage state. When the voltage gradually increases, the light emitting region may be moved to an interface between the emission layer 330 and the electron injection layer 341.

The emission layer 330 may include a matrix polymer, a phosphorescent host material and a phosphorescent dopant.

The matrix polymer comprises at least one selected from the group consisting of polyphenylvinylene, polyvinylcarbazole, polyfluorene and derivatives thereof.

The phosphorescent host material may be one or more carbarzole compounds.

The carbazole compound may include at least one selected from the group consisting of N,N-dicarbazolyl-3,5-benzene, 1,3,5-tri(9-carbazolyl)benzene, 4,4'-bis(N-carbazolyl)-1,1'-biphenyl, 4,4'-biscarbazolyl-2,2'-dimethybiphenyl, 4,4',4"-tri(N-carbazolyl)triphenylamine, 1,3,5-tri(2-carbazolylphenyl)benzene, 1,3,5-tri(2-carbazolyl-5-methoxyphenyl)benzene and bis(4-carbazolyl)silane.

The phosphorescent dopant may include at least one selected from the group consisting of bisthienylpyridine acetylacetonate iridium, bis(benzothienylpyridine)acetylacetonate Iridium, bis(2-phenylbenzothiazole)acetylacetonate iridium, bis(1-phenylisoquinoline) iridium acetylacetonate, tris(1-phenylisoquinoline) Iridium and tris(2-phenylpyridine) iridium.

The electron transport layer 341 may be disposed on the emission layer 330. The thickness of the electron transport layer 330 may be in a range of about 10 Å to about 300 Å.

Figure 4:
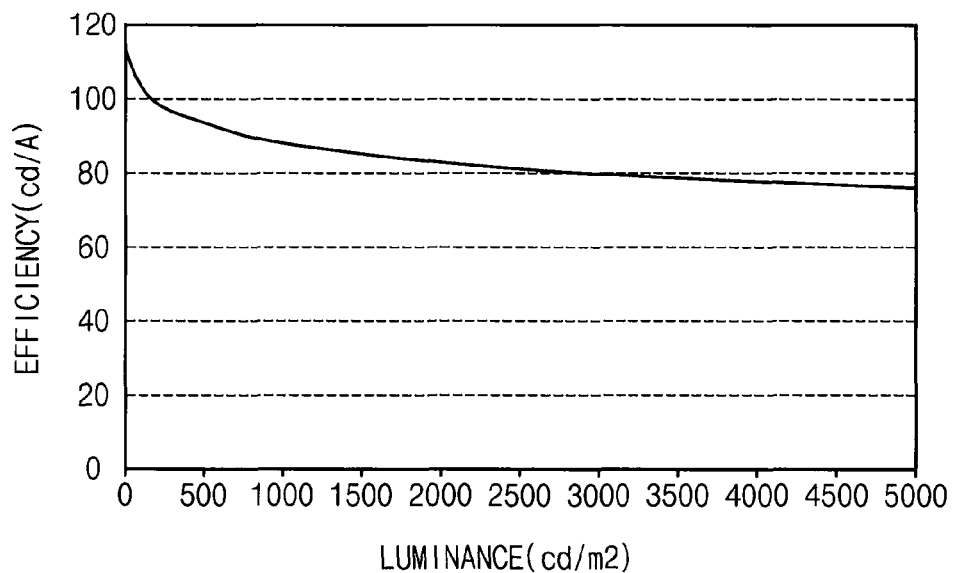
FIG. 4 is a graph illustrating an effect of an organic light emitting apparatus.
Figure 5:
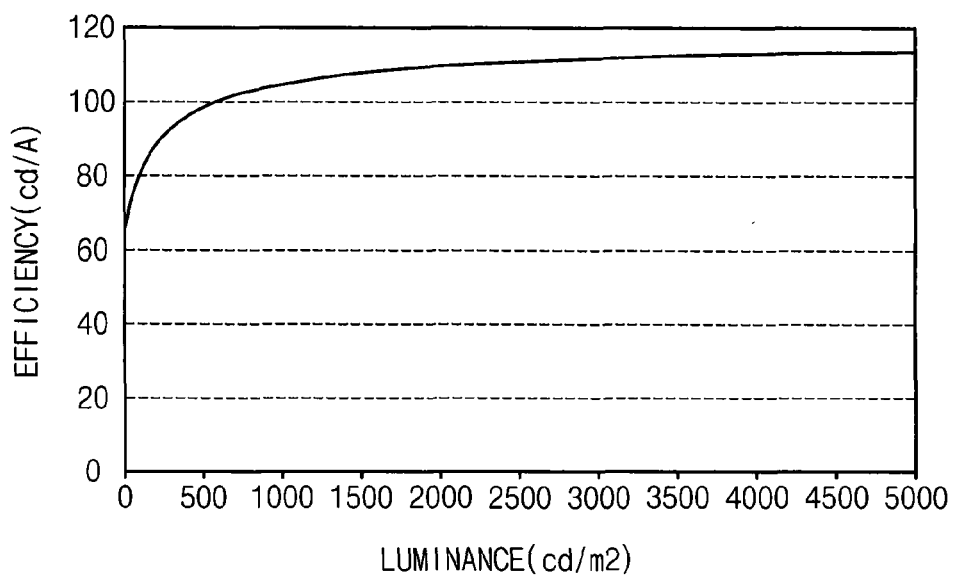
FIG. 5 is a graph illustrating an effect of an organic light emitting apparatus.

FIGS. 4 and 5 are graphs illustrating effects of an organic light emitting apparatus.

FIG. 4 is a graph illustrating a current efficiency of an organic light emitting apparatus including an optical compensation layer OCL having a material, which is identical to a material of a hole transport layer 322. FIG. 5 is a graph illustrating a current efficiency of an organic light emitting apparatus including an optical compensation layer OCL including a phosphorescent host material as N,N-dicarbazolyl-3,5-benzene.

Referring to FIG. 4, when a luminance is 10 cd/m$^2$, that is a low gray scale area, a current efficiency is about 110 cd/A. When the luminance is 5000 cd/m$^2$, that is a high gray scale area, the current efficiency is about 75 cd/A. Therefore, it can be noted that the current efficiency decreases when the luminance increases.

Referring to FIG. 5, when a luminance is 10 cd/m$^2$, that is a low gray scale area, a current efficiency is about 65 cd/A. When the luminance is 5000 cd/m$^2$, that is a high gray scale area, the current efficiency is about 110 cd/A. Therefore, it can be noted that the current efficiency increases when a luminance increases.

In other words, it can be noted that the roll-off phenomenon in which the luminance efficiency sharply decreases by saturation of luminous bodies is improved.

Although it is not illustrated in the figures, an organic light emitting apparatus may be manufactured by the followings. A first electrode may be coated on a first substrate. A pixel defied layer may be coated on the first substrate. A hole injection layer may be coated on the first substrate. A hole transport layer may be coated on the hole injection layer. An optical compensation layer including a phosphorescent host material may be coated on the hole transport layer. An emission layer may be coated on the optical compensation layer. The electron transport layer may be coated on the emission layer. The electron injection layer may be coated on the electron transport layer. The second electrode may be coated on the electron injection layer.

In some embodiments, a method for manufacturing the organic light emitting apparatus can include: indium tin oxide (ITO) is coated on the first substrate, to form an anode. N,N'-diphenyl-N,N'-bis-[4-(phenyl-m-tolyl-amino)-phenyl]-biphenyl-4,4'-diamine (DNTPD) is coated on the anode, to form a hole injection layer. The hole injection layer has a thickness of 10 nm to 130 nm. N, N-di(1-naphthyl)-N,N-diphenylbenzidine (NPB) is coated on the hole injection layer, to thereby form a hole transport layer. The hole transport layer has a thickness of 20 to 60 nm. N,N-dicarbazolyl-3,5-benzene (mCP) is coated on the hole transport layer, to form an optical compensation layer. The optical compensation layer has a thickness of 30 to 50 nm. An emission material including 4,4(-N,N-dicarbazole) biphenyl (CBP) as a phosphorescent host material and iridium (III) bis-1-phenylquinoline acetylacetonate as a phosphorescent dopant is coated on the optical compensation layer, to form an emission layer. The emission layer has a thickness of 30 to 40 nm. 2,9-dimethyl-4,7-diphenyl-1,10-phenanthroline (BCP) is coated on the emission layer, to form an electron transport layer. The transport layer has a thickness of from about 5 nm to about 10 nm. tris-(8-hydroxyquinoline) aluminium is coated on the electron transport layer, to form an electron injection layer. The electron injection layer has a thickness of about 20 nm. Lithium-fluorine (LiF) and magnesium-silver (MgAg) are coated on the electron injection layer to thereby form a cathode. Lithium-fluorine has a thickness of about 1 nm. Magnesium-silver has a thickness of about 12 nm. A protection layer is formed on the cathode.

In some embodiments, a stain may be decreased and a roll-off phenomenon may be improved. Thus, an organic light emitting diode and an organic light emitting apparatus with improved resolution are provided.

Although exemplary embodiments of the present invention have been described, it is understood that the present invention should not be limited to these exemplary embodiments and various changes and modifications can be made by one of those ordinary skilled in the art within the spirit and scope of the present invention as hereinafter claimed.

The foregoing is illustrative of the invention and is not to be construed as limiting thereof. Although a few exemplary embodiments of the invention have been described, those skilled in the art will readily appreciate that many modifications are possible in the exemplary embodiments without materially departing from the novel teachings and advantages of the invention. Accordingly, all such modifications are intended to be included within the scope of the invention as defined in the claims. In the claims, means-plus-function clauses are intended to cover the structures described herein as performing the recited function and not only structural equivalents but also equivalent structures. Therefore, it is to be understood that the foregoing is illustrative of the invention and is not to be construed as limited to the specific exemplary embodiments disclosed, and that modifications to the disclosed exemplary embodiments, as well as other exemplary embodiments, are intended to be included within the scope of the appended claims. The invention is defined by the following claims, with equivalents of the claims to be included therein.

What is claimed is:

1. An organic light emitting diode comprising:
    a hole injection layer;
    a hole transport layer comprising an amine compound and disposed on the hole injection layer;
    an optical compensation layer disposed on the hole transport layer;
    an emission layer disposed on the optical compensation layer;
    an electron transport layer disposed on the emission layer; and
    an electron injection layer disposed on the electron transport layer,
    wherein the optical compensation layer is disposed between the hole transport layer and the emission layer and comprises a carbazole-based phosphorescent host material.

2. The organic light emitting diode of claim 1, wherein a thickness of the optical compensation layer is in a range from about 20 nm to about 50 nm.

3. The organic light emitting diode of claim 1, wherein the phosphorescent host material comprises N,N-dicarbazolyl-3,5-benzene.

4. The organic light emitting diode of claim 1, wherein the hole transport layer comprises at least one selected from the group consisting of N,N'-bis(3-methylphenyl)-N,N'-diphenyl-(1,1-biphenyl)-4,4'-diamine and N,N'-di-1-naphthyl-N,N'-diphenyl-1,1'-biphenyl-4,4'-diamine.

5. The organic light emitting diode of claim 1, wherein the emission layer comprises a matrix polymer, a phosphorescent host material and a phosphorescent dopant.

6. The organic light emitting diode of claim 5, wherein the matrix polymer comprises at least one selected from the group consisting of polyphenylvinylene, polyvinylcarbazole, polyfluorene and derivatives thereof.

7. The organic light emitting diode of claim 1, wherein the phosphorescent host material comprises carbarzole compound.

8. The organic light emitting diode of claim 6, wherein the carbazole compound comprises at least one selected from the group consisting of N,N-dicarbazolyl-3,5-benzene, 1,3,5-tri(9-carbazolyl)benzene, 4,4'-bis(N-carbazolyl)-1,1'-biphenyl, 4,4'-biscarbazolyl-2,2'-dimethybiphenyl, 4,4',4"-tri(N-carbazolyl)triphenylamine, 1,3,5-tri(2-carbazolylphenyl)benzene and 1,3,5-tri(2-carbazolyl-5-methoxyphenyl)benzene and bis(4-carbazolyl)silane.

9. The organic light emitting diode of claim 5, wherein the phosphorescent dopant comprises at least one selected from the group consisting of bis(thienylpyridine) acetylacetonate iridium, bis(benzothienylpyridine)acetylacetonate iridium, bis(2-phenylbenzothiazole)acetylacetonate iridium, bis(1-phenylisoquinoline) iridium acetylacetonate, tris(1-phenylisoquinoline) iridium and tris(2-phenylpyridine) iridium.

10. The organic light emitting diode of claim 1 further comprising:
   a first electrode disposed on a lower surface of the hole injection layer; and
   a second electrode disposed on an upper surface of the electron injection layer.

11. The organic light emitting diode of the claim 9, wherein the first electrode is an anode and the second electrode is a cathode.

12. An organic light emitting apparatus comprising:
   a first substrate and a second substrate facing the first substrate,
   a first electrode disposed on the first substrate;
   a hole injection layer disposed on the first substrate;
   a hole transport layer comprising an amine compound and disposed on the hole injection layer;
   an optical compensation layer disposed on the hole transport layer, wherein optical an emission layer disposed on the optical compensation layer;
   an electron transport layer disposed on the emission layer;
   an electron injection layer disposed on the electron transport layer; and
   a second electrode disposed on the electron injection layer,
   wherein the optical compensation layer is disposed between the hole transport layer and the emission layer and comprises a carbazole-based phosphorescent host material.

13. The organic light emitting apparatus of claim 12, wherein a thickness of the optical compensation layer is in a range from about 20 nm to about 50 nm.

14. The organic light emitting apparatus of claim 12, wherein the phosphorescent host material comprises N,N-dicarbazolyl-3,5-benzene.

15. The organic light emitting apparatus of claim 12, wherein the hole transport layer comprises at least one selected from the group consisting of N,N'-bis(3-methylphenyl)-N,N'-diphenyl-(1,1-biphenyl)-4,4'-diamine, N,N'-di-1-naphthyl-N,N'-diphenyl-1,1'-biphenyl-4,4'-diamine.

16. The organic light emitting apparatus of claim 12, wherein the emission layer comprises a matrix polymer, a phosphorescent host material and a phosphorescent dopant.

17. The organic light emitting apparatus of claim 16, wherein the phosphorescent host material is carbazole compound.

18. The organic light emitting apparatus of claim 17, wherein the carbazole compound comprises at least one selected from the group consisting of N,N-dicarbazolyl-3,5-benzene, 1,3,5-tri(9-carbazolyl)benzene, 4,4'-bis(N-carbazolyl)-1,1'-biphenyl, 4,4'-biscarbazolyl-2,2'-dimethybiphenyl, 4,4',4"-tri(N-carbazolyl)triphenylamine, 1,3,5-tri(2-carbazolylphenyl)benzene, 1,3,5-tri(2-carbazolyl-5-methoxyphenyl)benzene and bis(4-carbazolyl)silane.

19. The organic light emitting apparatus of claim 12, further comprising a protection layer disposed on the first substrate and covering the second electrode.

20. The organic light emitting apparatus of claim 12, wherein the first electrode is an anode and the second electrode is a cathode.

* * * * *